United States Patent
Gerhard

(12) 
(10) Patent No.: US 6,469,331 B2
(45) Date of Patent: *Oct. 22, 2002

(54) MONOLITHIC INTEGRATED CIRCUIT WITH SEVERAL CAPACITORS FORMING BYPASS TO GROUND

(75) Inventor: Gregor Gerhard, Murrhardt (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/384,125

(22) Filed: Aug. 27, 1999

(65) Prior Publication Data

US 2002/0000637 A1 Jan. 3, 2002

(30) Foreign Application Priority Data

Nov. 9, 1998 (DE) ......................... 198 51 458

(51) Int. Cl.⁷ ............................................... H01L 29/80
(52) U.S. Cl. ..................... 257/275; 257/532; 257/774
(58) Field of Search ................................. 257/532, 207, 257/275, 276, 277, 533, 534, 535, 698, 700, 728, 774, 924; 438/396, 667; 361/301.4, 306.2, 306.3, 311, 312, 313, 321.1–321.6, 328

(56) References Cited

U.S. PATENT DOCUMENTS

| | | | |
|---|---|---|---|
| 4,153,988 A | | 5/1979 | Doo |
| 4,553,050 A | * | 11/1985 | Feinberg et al. ............ 307/443 |
| 4,751,562 A | * | 6/1988 | Yamamura ................... 357/51 |
| 4,922,324 A | | 5/1990 | Sudo |
| 4,967,258 A | * | 10/1990 | Fithian et al. ............... 257/533 |
| 5,208,726 A | * | 5/1993 | Apel ............................ 257/532 |
| 5,313,693 A | | 5/1994 | Cachier |
| 5,465,007 A | | 11/1995 | Ikeda et al. |
| 5,563,762 A | * | 10/1996 | Leung et al. ............. 361/301.4 |
| 5,635,751 A | | 6/1997 | Ikeda et al. |
| 6,124,636 A | * | 9/2000 | Kusamitsu ................... 257/728 |
| 6,272,003 B1 | * | 8/2001 | Schaper .................... 361/306.2 |

FOREIGN PATENT DOCUMENTS

| | | |
|---|---|---|
| EP | 0 000 384 A1 | 1/1979 |
| EP | 0 098 167 | 1/1984 |
| EP | 0 397 391 A2 | 11/1990 |
| EP | 0 545 809 A1 | 6/1993 |
| FR | 2 621 174 | 3/1989 |

OTHER PUBLICATIONS

"Design Guide, GaAs Foundry Services", von Texas Instruments, Version 4.2, Feb. 1997, pp. 1–6.

IEEE Transactions on Mictowave Theory and Techniques, vol. 45, No. 12, Nov. 1997, pp. 2256–2260.

* cited by examiner

Primary Examiner—Sara Crane
(74) Attorney, Agent, or Firm—Michael J. Striker

(57) ABSTRACT

A monolithic integrated circuit has a plurality of capacitors forming a bypass to ground, each of the capacitors being composed of two conductive coatings layers which are arranged on a substrate and separated from one another by a dielectric layer, a lower one of the coatings located on the substrate under the dielectric layer contacting with a ground conductor on an opposite substrate side, and the lower coatings of the capacitors being connected with one another, while only one upper coating which belongs to a capacitor is contacted through a through contacting in the substrate with the ground conductor.

5 Claims, 1 Drawing Sheet

MONOLITHIC INTEGRATED CIRCUIT WITH SEVERAL CAPACITORS FORMING BYPASS TO GROUND

BACKGROUND OF THE INVENTION

The present invention relates to a monolithic integrated circuit with several capacitors form serve a bypass to ground.

More particularly, it relates to such a monolithic integrated circuit in which each capacitor is composed of two coatings located on a substrate and separated by a dielectric layer, wherein a lower coating located on the substrate under the dielectric layer is contacted with a ground conductor on the opposite substrate side.

Such a construction of monolithically integrated capacitors is known from "Design Guide, Gas Foundry Services" of Texas Instruments Version 4.2, February 1997, pages 1–7.

In a monolithically integrated microwave circuit "MMIC", conventionally a highest possible packing density of the individual switching elements is desired. When in a circuit several capacitors which form a bypass to ground are provided, then due to the ground connections of the capacitors through contactings in the substrate a relatively great distance between the capacitors is maintained, since with a small distance of the through contacting the substrate has a tendency to break. The minimal permissible distances between the through contactings are also relatively great since the diameter of the through contactings conically increases toward the substrate lower side provided with the ground conductor, which is inavoidable for production of the through contactings from technological reasons. Circuits with several capacitors which form a bypass to ground, for example such as disclosed in IEEE Transactions on Microwave Theory and Technique, volume 45, No. 12, December 1997, page 2256–2260 require an amplifier circuits for blocking of high frequency signals relative to bias voltage circuits.

SUMMARY OF THE INVENTION

Accordingly, is an object of present invention to provide a monolithic integrated circuit with several capacitors forming a bypass to ground, in which the capacitors can be arranged relative to one another at smallest possible distances.

In keeping with these objects and with others which will become apparent hereinafter, one feature of present invention resides, briefly stated, in a monolithic integrated circuit, in which the lower coatings of the capacitors are connected with one another, and the lower coating which belongs to only one capacitor is connected to a through contacting in the substrate with a ground conductor.

In the monolithic integrated circuit designed in accordance with the present invention, no longer for each individual capacitor a single through contacting must be provided, whereby the minimal permissible distances between the capacitors are substantially reduced.

In accordance with a further feature of present invention it is advantageous to form the lower coatings of all capacitors from a single lower coating. Moreover, it is advantageous when for capacitors which are dimensioned for different frequency regions, the through contacting for such capacitors is provided which is dimensioned for a higher frequency region than other capacitors.

Preferably, the circuit of several capacitors which form a bypass to ground can be used in a amplifier circuit for blocking high frequency signals relative to a bias voltage. For this purpose two capacitors which form a bypass to ground are connected parallel, wherein one of the both capacitors for high frequency signals in the operational frequency band of the amplifier and the other capacitor for high frequency signal below the operational frequency band form a short circuit to ground.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF PREFERRED EMBODIMENTS

Figure 1:
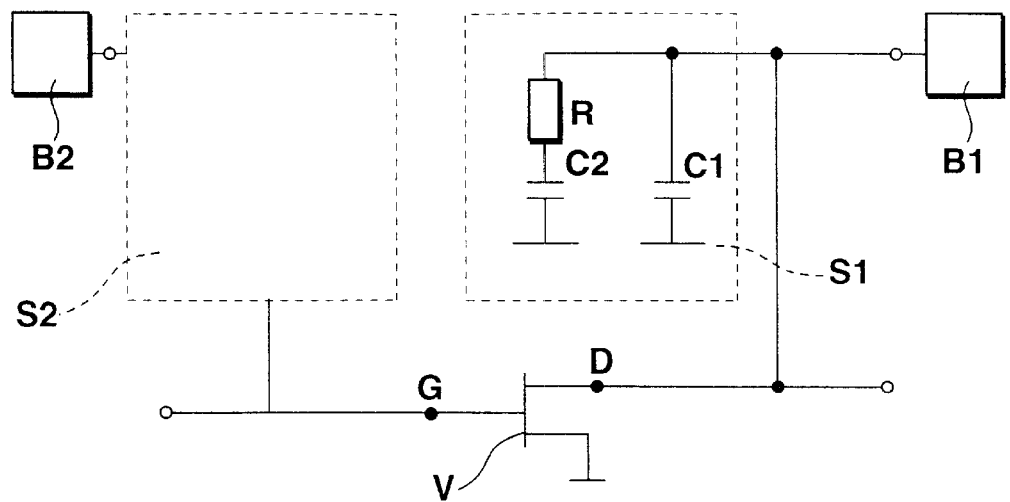
FIG. 1 is a diagram of an amplifier provided with two ground contacted capacitors, of the inventive monolithically integrated circuit.

A circuit S1 is shown in FIG. 1 and has two capacitors C1 and C2 which form a bypass to ground. An ohmic resistor R is connected in series to the capacitor C2. Such a circuit S1, as shown in FIG. 1, is used for example in an amplifier stage V which is composed for example of a field effect transistor.

The circuit S1 with two capacitors C1 and C2 forming a bypass to ground is connected to an output of the amplifier V, here the drain-electrode D of the field effect transistor, to block the high frequency signals at the output of the amplifier V relative to a bias voltage network B1. For the same purpose also a circuit S2, which is formed similarly to the circuit S1, can be connected to the input of the amplifier V, here the gate-electrode G of the field effect transistor, for blocking the high frequency input signals relative to a bias voltage network B2. It is to be understood that in addition to the embodiment shown in FIG. 1, also other applications for the circuits with several capacitors forming a bypass to ground are possible.

In order to provide a monolithic integration of both capacitors C1 and C2 with a smallest possible distance on a substrate, only a single through contacting for the ground terminal is provided for both capacitors C1 and C2. Therefore an individual through contacting for each capacitor can be dispensed with and as a result the permissible minimal distance between the capacitors can be relatively great.

Figure 2:
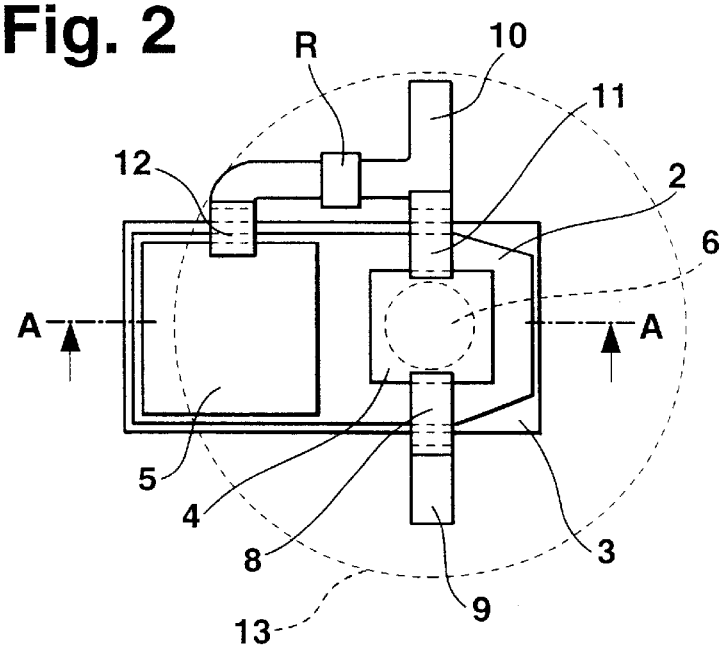
FIG. 2 is a plan view of monolithically integrated capacitors, of the inventive monolithically integrated circuit.
Figure 3:
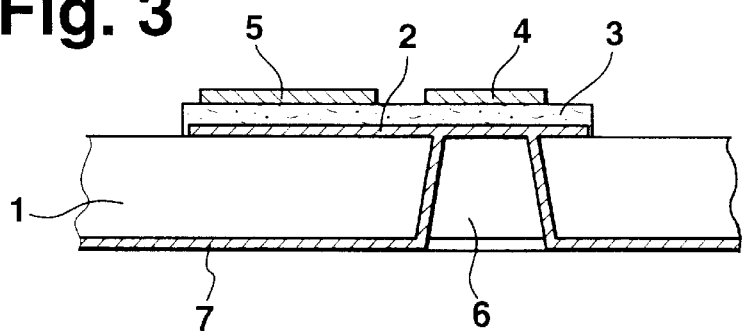
FIG. 3 is a view showing a cross-section A—A through the monolithically integrated circuit of FIG. 2.

FIG. 2 shows a plan view of two capacitors which are monolithically integrated on a substrate, and FIG. 3 shows a cross-section A—A through the substrate with the capacitors located on it. On a substrate 1, which is for example a GaAs substrate, a lower conductive coating 2 is applied. It constitutes a first electrode for both capacitors. A dielectric layer 3 is located on the lower coating 2. Two upper conductive coatings 4 and 5 are applied on the dielectric layer 3 and form two electrodes for the both capacitors.

The capacitors contain their bypasses to ground through a single through contacting 6 introduced in the substrate 1. It connects the joint conductive coating 2 of both capacitors with a ground conductor 7 available on the opposite substrate side. The upper conducting coating 4 of the first capacitor C1 is connected through a conductive air bridge 8 with a terminal conductor 9 leading to the drain electrode D. A terminal conductor 10 which leads to the bias voltage network B1 is connected both through a conductive air bridge 11 with the upper conductive coating 4 of the first capacitor C1 and through a conductive air bridge 12 with the upper coating 5 of the second capacitor C2. The resistor R connected in series to the capacitor C2 is integrated in the terminal conductor for the upper coating 5 of the second capacitor C2.

In FIG. 2 a broken line circle 13 around the through contacting 6 identifies which minimal distance must be maintained for a further through contacting which is introduced first outside the circle 13 in the substrate 1. The illustration makes clear that the both capacitors in the case of only one through contacting can be arranged considerably closer to one another than when there are two through contactings.

The through contacting 6 is arranged preferably directly under the corresponding capacitor, which is dimensioned for the higher frequency region. In the shown embodiment, the capacitor C1 is formed for the higher frequency region, namely the operational frequency region of the amplifier V, while to the contrary the second capacitor C2 is dimensioned for a frequency region below the operational frequency band. The higher the frequency region, the more intensely the conductor length acts on parasitic inductivities.

The conductor length directly provided with the position of the through contacting 6 under the capacity designed for the higher frequency region is the smallest between the ground conductor 7 and the lower conducting coating 2 for this capacity. For the other capacity with the upwardly located coating 5 the conductor length between the ground conductor 7 and its lower conductive coating 2 via the through contacting 6 is longer. However, it is less disturbing since this capacity is designed for a lower frequency region.

It will be understood that each of the elements described above, or two or more together, may also find a useful application in other types of constructions differing from the types described above.

While the invention has been illustrated and described as embodied in monolithic integrated circuit with several capacitors forming bypass to mass, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

What is claimed is:

1. A monolithic integrated circuit, comprising a plurality of capacitors forming a bypass to a ground, each of the capacitors being composed of two conductive coatings which are arranged on a substrate and separated from one another by a dielectric layer, lower ones of the coatings being located on said substrate under said dielectric layer, a ground conductor being provided on a substrate side opposite said lower coatings, and said lower coatings of said capacitors being connected with one another and being contacted through a single contacting in said substrate with said ground conductor.

2. An amplifier device, comprising an amplifier circuit and a monolithic integrated circuit including a plurality of capacitors forming a bypass to a ground, each of the capacitors being composed of two conductive coatings which are arranged on a substrate and separated from one another by a dielectric layer, lower ones of the coatings being located on said substrate under said dielectric layer, a ground conductor being provided on a substrate side opposite said lower coatings, and said lower coatings of said capacitors being connected with one another and being contacted through a single contacting in said substrate with said ground conductor, said monolithic integrated circuit being used in said amplifier circuit for shunting high-frequency signals at an input or at an output of said amplifier circuit.

3. A circuit as defined in claim 1, wherein said lower coatings of all capacitors are formed as a joint lower coating.

4. A circuit as defined in claim 1, wherein said capacitors have different operating frequencies, said through contacting being formed for such a capacitor which has a higher operating frequency region that other capacitors.

5. An amplifier device as defined in claim 2, wherein one of said capacitors is for shunting high frequency signals in an operational frequency band of said amplifier circuit and the other of said capacitors is for shunting high frequency signals below the operational frequency band.

* * * * *